United States Patent [19]

Douglas

[11] Patent Number: 5,695,570
[45] Date of Patent: Dec. 9, 1997

[54] METHOD FOR THE PHOTO-STIMULATED REMOVAL OF TRACE METALS FROM A SEMICONDUCTOR SURFACE

[75] Inventor: Monte Allan Douglas, Coppell, Tex.

[73] Assignee: Texas Instruments Incorporated, Dallas, Tex.

[21] Appl. No.: 226,237

[22] Filed: Apr. 11, 1994

Related U.S. Application Data

[63] Continuation of Ser. No. 893,581, Jun. 2, 1992, abandoned, which is a continuation of Ser. No. 667,609, Feb. 28, 1991, abandoned.

[51] Int. Cl.$^6$ .................... B08B 3/04; B08B 7/04
[52] U.S. Cl. .................... 134/1.3; 134/21; 134/31
[58] Field of Search .................... 134/1, 21, 31, 134/26, 34, 36, 37; 156/643, 662; 437/946; 148/DIG. 17

[56] References Cited

U.S. PATENT DOCUMENTS

| | | | |
|---|---|---|---|
| 4,028,135 | 6/1977 | Vig et al. | 134/1 |
| 4,132,567 | 1/1979 | Blackwood | 134/1 |
| 4,186,032 | 1/1980 | Ham | 134/31 |
| 4,885,047 | 12/1989 | Ury et al. | 134/1 |
| 4,895,604 | 1/1990 | Hayashi et al. | 134/31 |
| 4,902,350 | 2/1990 | Steck | 134/1 |
| 5,024,968 | 6/1991 | Engelsberg | 437/173 |
| 5,078,832 | 1/1992 | Tanaka | 156/639 |
| 5,099,557 | 3/1992 | Engelsberg | 29/25.01 |

FOREIGN PATENT DOCUMENTS

| | | | |
|---|---|---|---|
| 0 286 233 A | 3/1988 | European Pat. Off. . | |
| 391 035 | 8/1990 | European Pat. Off. . | |
| 0 567 939 A | 4/1993 | European Pat. Off. . | |
| 0077430 | 5/1985 | Japan | 134/1 |
| 0153982 | 8/1985 | Japan | 134/1 |
| 60-0113292 | 12/1986 | Japan . | |
| 63-033824 | 2/1988 | Japan . | |
| 0095627 | 4/1988 | Japan | 134/1 |
| 0226156 | 9/1989 | Japan | 134/1 |
| 1226156 | 9/1989 | Japan . | |
| 880254916 | 4/1990 | Japan . | |
| 890218975 | 4/1991 | Japan . | |
| 900188702 | 3/1992 | Japan . | |

OTHER PUBLICATIONS

Douglas, et al "Photostimulated Removal of Trace Metals", Journal of the Electrochemical Society, vol. 138, No. 9 Sep. 1991. pp.2799–2802.

Sugino, et al., "Characterization of Si–SiO$_2$ Interfaces Formed after Photo–Excited Cleaning", *Extended Abstracts of the 21st Conference on Solid State Devices and Materials*, Tokyo, 1989, pp. 417–420.

Imen, et al., "Laser–assisted micron scale particle removal", *Applied Physics Letters*, pp. 203–205, vol. 58, No. 2, Jan. 14, 1991.

Douglas, et al., "Photostimulated Removal of Trace Metals", *Journal of the Electrochemical Society*, pp. 2799–2802, vol. 138, No. 9, Sep. 1991.

*Primary Examiner*—Jill Warden
*Assistant Examiner*—Saeed Chaudhry
*Attorney, Agent, or Firm*—Dana L. Burton; James C. Kesterson; Richard L. Donaldson

[57] ABSTRACT

Generally, and in one form of the invention, a method is presented for the photo-stimulated removal of trace metals 16 from a surface 11, comprising the steps of covering the surface 11 with an ambient species 14, exciting the trace metals 16 and/or the ambient species 14 by photo-stimulation sufficiently to allow reaction of the trace metals with the ambient species to form metal products, and removing the ambient species 14 and the metal products from the surface 11.

Other methods are also disclosed.

12 Claims, 4 Drawing Sheets

METHOD FOR THE PHOTO-STIMULATED REMOVAL OF TRACE METALS FROM A SEMICONDUCTOR SURFACE

This is a continuation of application Ser. No. 07/893,581, filed Jun. 2, 1992, now abandoned, which is a continuation of Ser. No. 07/667,609, filed Feb. 28, 1991, now abandoned.

FIELD OF THE INVENTION

This invention generally relates to photo-stimulated removal of trace metals.

BACKGROUND OF THE INVENTION

Without limiting the scope of the invention, its background is described in connection with the removal of trace metals from a semiconductor substrate surface, as an example.

The crucial influence of the purity of semiconductor substrate surfaces on fabrication yield and part reliability has been appreciated by the semiconductor industry from the very outset in the 1950s. Scaling rules, which define ULSI structural and electronic requirements, imply that cleaner surfaces are requisite for acceptable ULSI device yield, performance and reliability. Not only can trace metal impurities in silicon form mid-band gap states that infringe on the performance of MOS transfer gates, there is concern that they degrade the integrity and reliability of thin silicon oxide films used for the storage capacitor plate and MOS transistor dielectric. As minimum feature sizing decreases and scaling rules force the use of thinner dielectric films and shallower moat region doping profiles, the sensitivity of device performance and reliability to trace metal impurities is expected to increase. However, wafer cleaning chemistry has remained essentially unchanged for the past 25 years, primarily relying upon hot alkaline and acidic hydrogen peroxide solutions to remove metallic, particulate and other surface contamination which undermine device yield, performance and reliability.

Heretofore, in this field, the accepted method to decrease the incorporation of trace metals into the bulk and near-surface silicon involves cleaning the surface of the silicon prior to the fabrication steps which are sensitive to metal impurities, such as furnace operations (which tend to diffuse the metals deeper into the silicon). Wet caustic solutions, such as hot (145° C.) nitric acid, are used to remove metals that have been deposited on the surface of the wafer during the course of previous wafer handling and processing integral to device fabrication.

However, wet chemical processing exhibits a number of problems. Firstly, depending on the electrochemical potential of the metal in a given solution relative to the solution, and the solution PH, the wet solution can actually deposit metals in the solution onto the silicon substrate. The result is that instead of removing trace metals from the silicon surface, trace metal contaminants in the solution are deposited onto the silicon surface. The sensitivity and selectivity of surface analytical methods have not been sufficient to characterize the differences in effectiveness of wet cleanup chemistries relative to various types of contamination. Resultantly, it is not clear whether the present standard wet cleanup technology is being properly implemented or whether it may actually be limiting device yield, performance and reliability, particularly in the ULSI regime. Fortunately, new analytical methods, such as Total Reflectance X-ray Fluorescence (TRXRF) spectroscopy, for example, may be able to assay surface contamination at a level of sensitivity and selectivity that can distinguish between cleanup processes, providing data meaningful enough to relate them to device performance.

Secondly, the temperature of the wet solution is of grave concern, since the diffusion of metals into bulk silicon increases at higher temperatures. Some metals, such as Au and Cu, rapidly diffuse into silicon at room temperature. Hence, elevating the temperature of the metal removal solution probably only serves to drive surface trace metal contaminants into the bulk silicon, instead of removing them from the surface by altering the metals' oxidation state and putting them into solution.

Thirdly, even high-purity source chemicals exhibit unacceptable levels of contamination from particulates, chemical plating of metals and other sources of contamination. It is both very difficult and very expensive to remove particles and contaminants from the caustic solutions used to remove metals from a silicon/silicon oxide/etc. substrate. The caustic solution can also react with its environment, placing even more particles and trace contaminants into the solution. Hence, the caustic solution used to remove metals can actually introduce particles and contaminants onto the wafer that is subject to "cleaning".

Fourthly, the cost of producing high-purity, electronic-grade, caustic chemicals is extremely high. Moreover, it is not clear whether improvements in caustic chemical purity can track increasingly demanding ULSI fabrication requirements, particularly in view of the degradation of, and the contamination from, the particle and chemical filtration devices themselves, when exposed to these extremely reactive chemicals.

Fifthly, each of the solutions used to remove trace metals from a silicon wafer exhibit different removal efficiencies with respect to various metals. That is one particular solution may efficiently remove one metal yet at the same time be nearly ineffectual with respect to removing a second metal. The solution constituents, their relative concentrations and the sequence in which the solutions are used strongly influence the effectiveness of the cleanup toward particular contaminants. Because it is difficult to tailor one general cleanup process to accommodate even most of the reasonable sources of contamination, most practitioners suggest that a series of caustic solutions is necessary to achieve acceptable cleanup of all metals of concern.

Finally, the great expense associated with the purchase of these caustic cleanup chemicals is dwarfed by the greater expense of disposing of the used solutions. Very restrictive environmental regulations must be adhered to, and the environmental concerns and costs surrounding hazardous chemical disposal will likely increase in the future.

To address the above problems, dry cleanup processing has been proposed to remove surface metallic impurities. However, these methods use caustic, hazardous source gases which are difficult to clean. Additionally, these gases can react with the equipment used to transport the gases, producing particulate and chemical contamination on the very substrate to be cleaned. These so-called dry cleanup methods usually involve halogen radical generation and reaction with the metal to form a volatile metal halide product. Metals that do not form volatile metal halides are partially removed by the so-called "lift-off" method, which involves removal of the metal by etching the underlying silicon with the halogen radicals. The nonvolatile metal halide is removed, in part, by flowing with the volatile silicon halide mass stream. However, the silicon is etched by all of these methods, producing unacceptably rough silicon surface. Recent studies have demonstrated that current embodiments of these dry cleanup methods also degrade device performance compared to their wet acid cleanup counterpart.

Therefore, there is a strong interest in the semiconductor industry in developing an alternative substrate surface cleanup technology that can overcome some or all of these deficiencies.

SUMMARY OF THE INVENTION

It is herein recognized that a need exists for a method for the removal of trace metal contamination from a surface without the use of caustic chemicals. Specifically, it is desired that the cleanup method use ultra-pure source chemicals that are economical and non-hazardous, that it is effective for a broad spectrum of contaminants, that its implementation is not confounded by a large process parameter domain, and that it involve processing that satisfies the purity requirements posed by ULSI technology. The present invention is directed towards meeting those needs.

Generally, and in one form of the invention, a method is presented for the photo-stimulated removal of trace metals from a surface, comprising the steps of covering the surface with an ambient species, exciting the trace metals and/or the ambient species by photo-stimulation sufficiently to allow reaction of the trace metals with the ambient species to form metal products, and removing the ambient species and the metal products from the surface.

In another form of the invention, a method is presented for the photo-stimulated removal of trace metals from a semiconductor surface, comprising the steps of covering the semiconductor surface with deionized water, irradiating the semiconductor surface and the deionized water with visible and/or ultraviolet light, and draining the deionized water from the semiconductor surface.

In yet another form of the invention, a method is presented for the photo-stimulated removal of trace metals from a surface of a semiconductor, comprising the steps of placing the semiconductor into a vacuum environment, lowering the temperature of the semiconductor surface to the dew point, introducing water vapor into the vacuum environment, irradiating the semiconductor surface and any condensed water with visible and/or ultraviolet light and returning the environment to a vacuum.

An advantage of the invention is that it allows for the removal of trace metal contamination from a surface without the use of caustic chemicals.

BRIEF DESCRIPTION OF THE DRAWINGS

The foregoing and further aspects of the invention are illustrated in the accompanying drawings wherein like elements are denoted by like reference designators and in which.

DETAILED DESCRIPTION OF PREFERRED EMBODIMENTS

Figure 1:
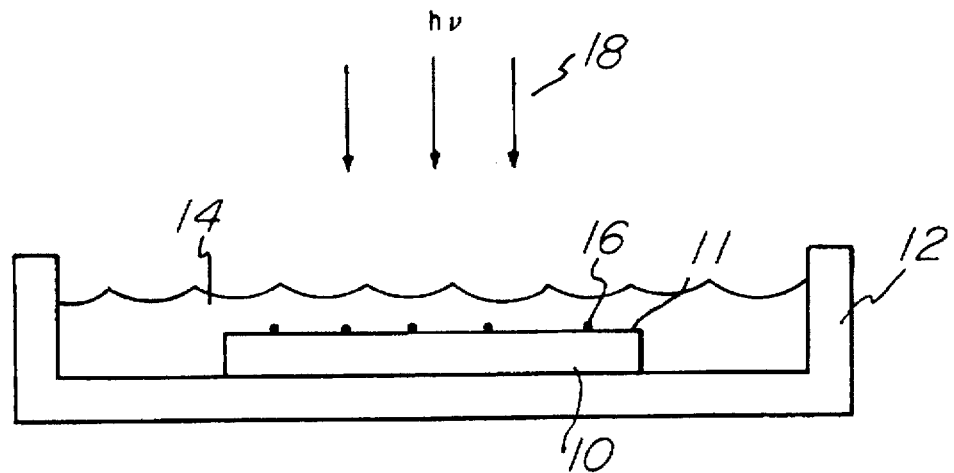
FIG. 1 is a cross sectional diagram of a suitable apparatus setup for implementing a first preferred embodiment method.

Table A lists the steps of a first preferred embodiment method for the photo-illuminated removal of trace metals from a semiconductor substrate (as an example). FIG. 1 illustrates a suitable apparatus setup to implement the method of Table A. Operations commence with step A1 in which the substrate 10 to be cleaned is placed into a receptacle 12. Then, in step A2, the substrate 10 is immersed in deionized water 14 at, for example, 25° C. such that the upper surface 11 of substrate 10 is completely covered. This places the deionized water 14 in physical contact with any trace metal contamination 16 on the semiconductor surface 11. Next, in step A3, the substrate 10/water 14 combination is irradiated with visible and ultraviolet light 18 from, for example, a 200 Watt, high pressure, Hg/Xe arc lamp for five minutes. Afterwards, in step A4, the deionized water 14 is drained from the substrate 10, which is then rinsed with deionized water for five seconds, for example, in step A5. Finally, in step A6, the substrate 10 is dried with nitrogen gas and is ready for further wafer processing.

TABLE A

| A1 | Place substrate into receptacle |
|---|---|
| A2 | Immerse substrate in deionized water |
| A3 | Irradiate substrate/water with visible/ultraviolet light |
| A4 | Drain water |
| A5 | Rinse substrate with deionized water |
| A6 | Dry substrate with nitrogen gas |

The first preferred embodiment of the present invention may optionally be modified in several ways. For example, the water 14 may be ultrasonically or megasonically agitated to provide a mechanical aid to the removal of the reaction products from the substrate surface 11. Also, rather than immersing the wafer 10 into a stagnant water 14 reservoir, it may be placed into a flowing or spraying water atmosphere. The moving water would ensure that solubility limits (which would limit removal by dissolution into the water) would not be achieved.

Although the chemistry of photo-stimulated removal of trace metals is not completely understood at the present time, it is believed that a possible mechanism for the reaction may involve electronic excitation of a ground-state, metal-water adduct precursor. The metal-water adduct precursor that is excited may be the metal 16 atom itself, or the ambient species (e.g. a water 14 molecule in the first preferred embodiment), or a complex that is formed between the two entities. The excitation may be electronic exaltation, vibrational excitation, dissociative excitation, etc., for example. The lifetime of the excitation is sufficient to allow reaction of the metal-water adduct to a metal product to proceed along an excited state reaction coordinate that is not encumbered by energy barriers that undermine reaction along the ground-state potential energy (PE) surface. Both the metal and the ambient species may need to be excited at the same time. The resultant product, which contains the contaminating metal, may then be removed from the surface of the wafer 10 along with the ambient species, or the product may diffuse into the ambient species and therefore be removed when the ambient species is removed. Whatever the mechanism may be, trace metal contamination on a surface can be removed.

Molecular-scale, metal atom/water and metal cluster/water ground state and photo-induced reactions have been examined by Margrave and co-workers for a broad spectrum of metals, isolated in cryogenic noble gas matrices, using IR, ESR and UV/IS spectroscopies (see Journal of Physical Chemistry, 89, pp.3547-3552 (1985), High Temperature Science, 25, pp.1-15 (1988), High Temperature Science, 18, pp.97-118 (1984), High Temperature Science, 17, pp.201-235 (1984), Journal of the Chemical Society, Faraday Transactions I, 79, pp.1533-1553 (1983) and High Temperature Science, 13, p.338 (1980)). Initial formation of a metal-water adduct was observed in most instances. It is believed that the metal coordinates with water's $3a_1$ MO (comprised mostly of the in-plane oxygen atom p-orbital which symmetrically splits the hydrogen atoms) to form an adduct. The adduct is described by $C_{2v}$ symmetry, with the metal atom lying in the plane of the water molecule and bonding through the oxygen atom. Adduct formation is evidenced by a decrease in the $v_2$ vibrational mode associated with charge transfer of electron density from the $3a_1$ water orbital to the metal atom. By annealing or photolysis of the rare gas matrix, the metal-water adduct formed H-(metal atom)-OH (HMOH) which frequently exhibited further reaction to form the metal hydroxide or the metal oxide. These studies were performed on metal and water species isolated in an inert cryogenic crystalline argon matrix and did not investigate the practical problem of a metal atom attracted to a semiconductor surface and interacting with liquid or vapor phase water.

The applicant has rationalized spontaneous versus photo-initiated metal-water reactivity, using orbital-to-orbital and state-to-state correlation diagrams. These studies have revealed the absence of a ground state activation barrier for metals, such as aluminum, that spontaneously formed HMOH. In contrast, activation energy barriers in the ground state PE surfaces, but not in certain excited-state PE Surfaces, have been calculated for metal-water moieties that required photolysis to form the metal insertion product. However, the nature of the interaction between the electronically excited metal atom/cluster-water species is not understood. Insight into this interaction will help to rationalize the mechanism that generates the metal insertion product, HMOH, and, ultimately, the metal hydroxide and metal oxide daughter products.

On the surface of a silicon substrate 10, the surface trace metal is most likely highly clustered compared to the matrix environment, and the metal-silicon surface interaction is much stronger compared to interaction with the noble gas matrix. Excited-state reaction dynamics studies suggest that the metal-water interaction may possibly be described by frontier orbital considerations. However, these studies do not account for strong electrostatic interactions. That is, the metal atom/cluster may be converted to a hard Lewis acid by photo-stimulation to an excited state. Water is a hard Lewis base, so the magnitude of the Coulombic term in the excited metal-water interaction depends upon the exact nature of Lewis acid generated by photoexcitation. In turn, this depends upon the metal and the characteristics of the electronic excitation. The reaction sequence from the reactive, excited state complex is not known for the surface metal-water entity. It is not unreasonable to adopt the reaction pathway, forming an insertion product which is unstable with respect to metal hydroxide and/or metal oxide. In any case, further work needs to be done in order to fully understand the reaction sequence for the surface metal-water chemistry. This lack of understanding of the exact nature of the chemical process does not, however, preclude the use of this phenomenon for the photo-stimulated removal of trace metals as, for example, described above in relation to the first preferred embodiment method.

Figure 2:
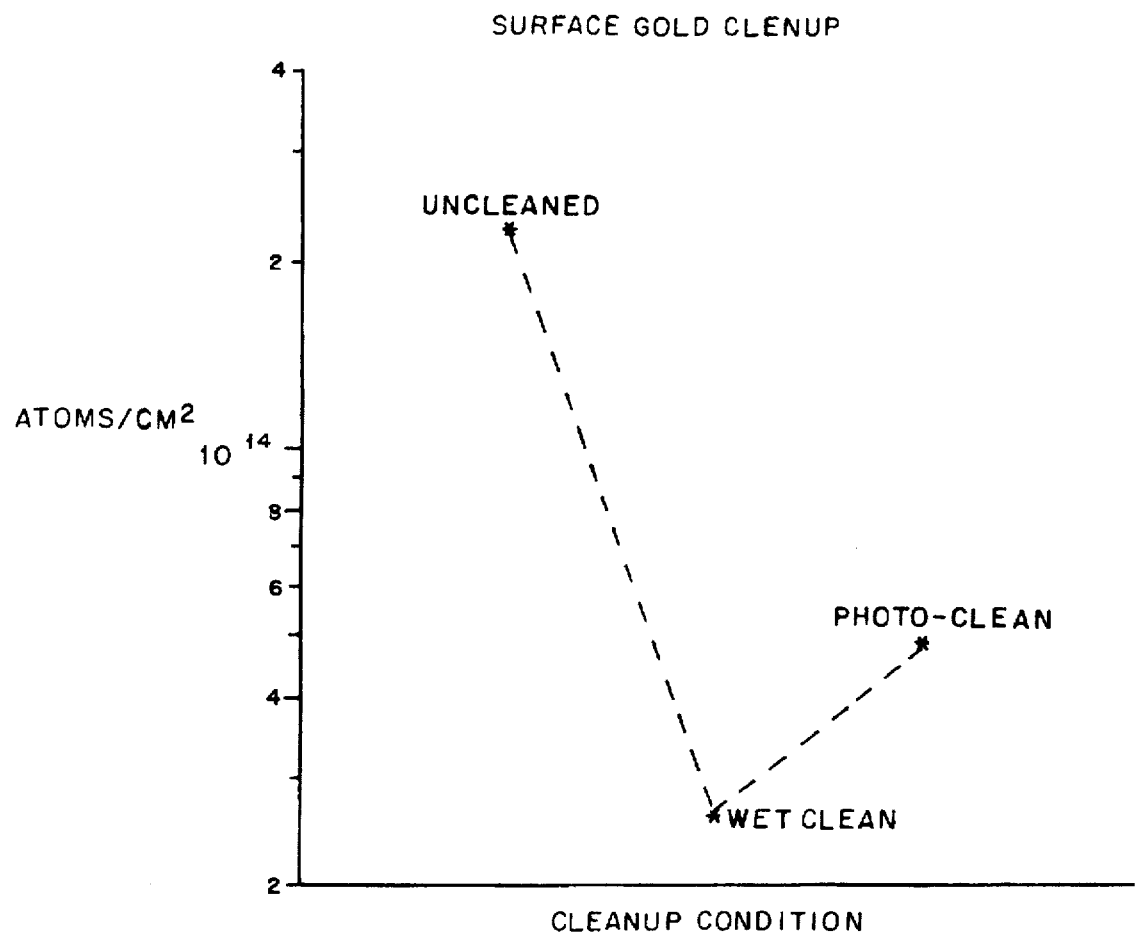
FIG. 2 is a logarithmic plot showing surface Au contamination of a control sample, a sample cleaned with wet acid cleanup and a sample cleaned with the photo-stimulated cleanup method.
Figure 3:
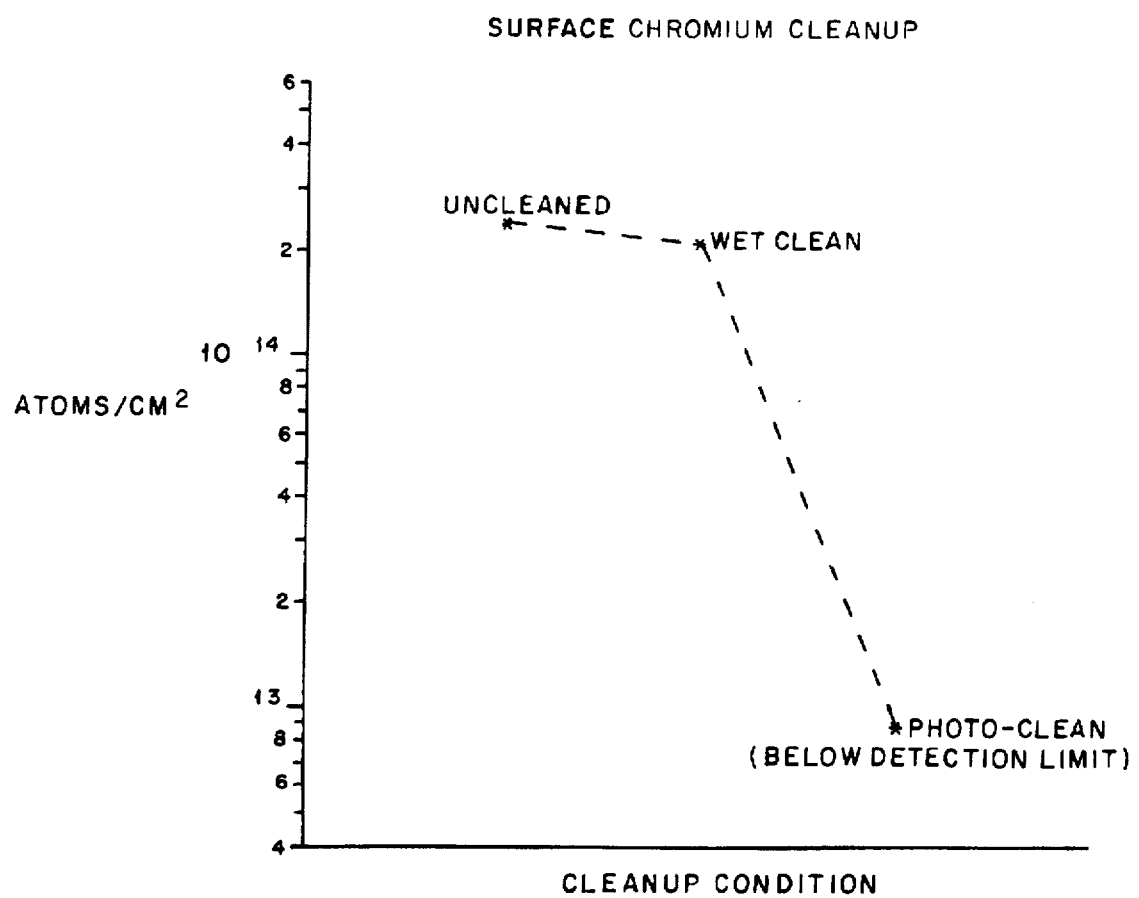
FIG. 3 is a logarithmic plot showing surface Cr contamination of a control sample, a sample cleaned with wet acid cleanup and a sample cleaned with the photo-stimulated cleanup method.
Figure 4:
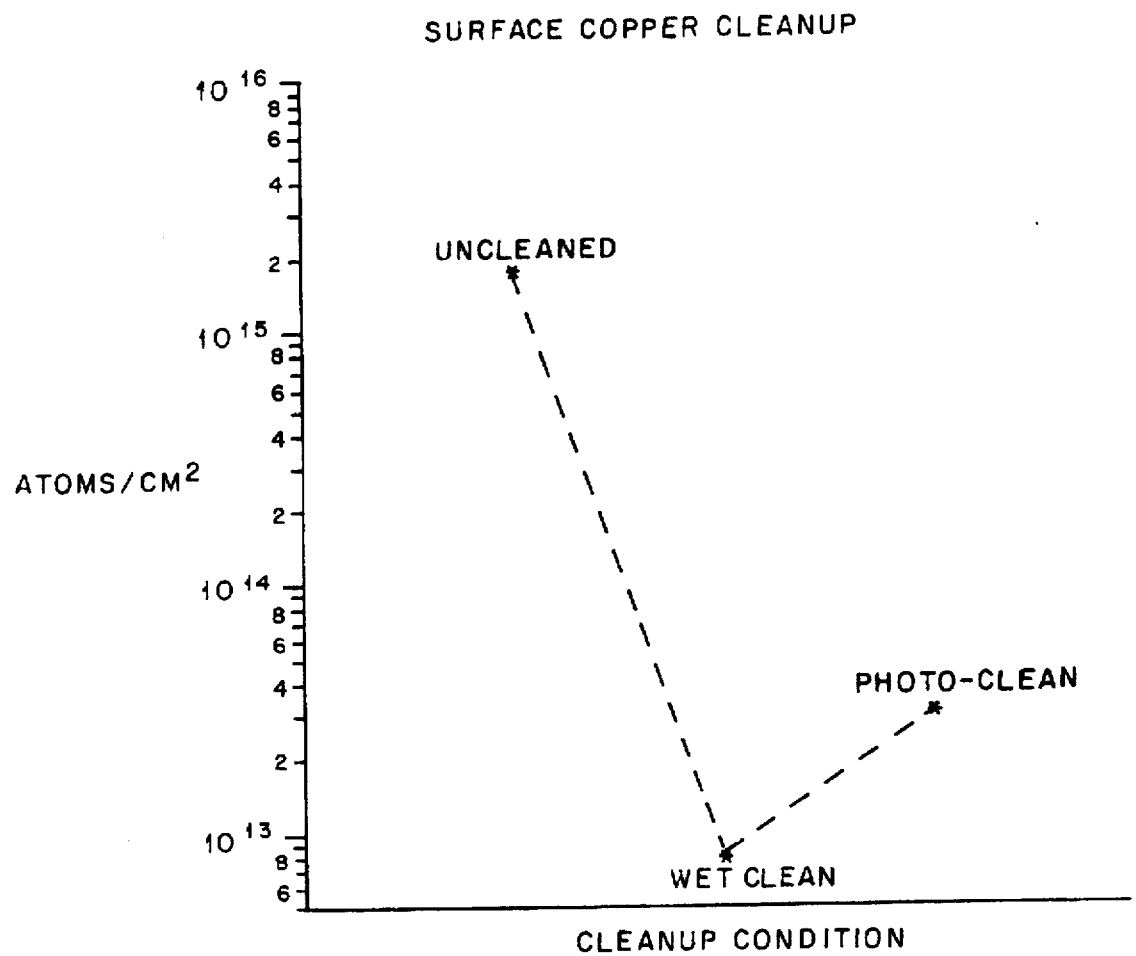
FIG. 4 is a logarithmic plot showing surface Cu contamination of a control sample, a sample cleaned with wet acid cleanup and a sample cleaned with the photo-stimulated cleanup method.

FIGS. 2, 3 and 4 illustrate preliminary results of the amount of metal removal, comparing the standard wet acid cleanup schedules of Table B to the first preferred embodiment photo-stimulation cleanup method of Table A for An, Cr and Cu, respectively. Each figure also illustrates the initial level of intentional metal contamination. Because of the large magnitude of metal removal for both wet and photo-stimulation removal methods, the metal surface concentration is plotted on a logarithmic scale. Gold, chromium and copper were evaporated onto individual, 100 mm, 15 Ohm-cm, n-type, (100) silicon wafer substrate surfaces by resistive heating. Three samples were prepared from each metal-deposited wafer. The first sample was not cleaned and served as a control to determine the level of trace metal surface contamination. The second sample was cleaned in a 200 ml bath containing standard acid cleanup solutions. Table B details the wet acid chemistry used to remove the intentional trace contamination for each metal. After the acid clean, the samples were rinsed with deionized water for five minutes and dried with nitrogen. The third sample was cleaned with the schedule of the first preferred embodiment, as illustrated in Table A. The surface metal concentration of each sample was measured by instrumental neutron activation analysis (INAA). Quantization of neutron flux was established by metal monitor samples. The above metals undergo neutron capture to produce radioactive products, whose decay can be monitored by gamma-ray spectroscopy. INAA of silicon wafers can exhibit surface sensitivity in the $1\times10^{11}$ atoms/cm$^2$ regime. Several counts were conducted at calculated time intervals to allow higher sensitivity to isotopes with longer half-lives.

TABLE B

| METAL | CLEANUP CHEMISTRY | RATIO | TEMP | TIME |
|---|---|---|---|---|
| Au | HCl(12N):H$_2$O$_2$(30%):H$_2$O | 5:1:4 | 35° C. | 5 MIN |
| Cr | H$_2$SO$_4$(17.8M):H$_2$O$_2$(30%) | 6:4 | 75° C. | 5 MIN |
| Cu | H$_2$SO$_4$(17.8M):H$_2$O$_2$(30%) | 6:4 | 75° C. | 5 MIN |

FIG. 2 shows that the wet acid cleanup of Table B removed slightly more surface Au than the photo-stimulated cleanup of Table A. However, both cleanup methods removed smaller amounts of the trace surface Au contamination than one might expect. The acid clean removed approximately 88 percent, and the photo-stimulated clean removed approximately 78 percent of the Au. The poor removal on the part of both methods may be related to gold's high diffusion coefficient into single crystal silicon at room temperature. Diffusion effects may be particularly pronounced, considering the method of intentional contamination by resistive heat evaporation. Nonetheless, maintaining the wafer substrate 10 temperature as low as possible during the cleanup process is an important consideration that can be implemented by the photo-stimulated clean technique without influencing removal efficiency. In contrast, some of the wet acid cleanup chemistries require elevated temperatures to activate metal removal. This can lead to surface metal "removal" by diffusion of the metal into the bulk. In turn, this can result in misleading removal figures while degrading actual device performance, reliability and yield, compared to processing that removes contamination 16 from the wafer 10 instead of diffusing contamination 16 into the wafer 10.

FIG. 3 shows that the photo-stimulated cleanup of Table A not only removed a larger absolute amount of surface chromium contamination compared with the Au removal of FIG. 2, but also removed significantly more Cr than did the wet acid cleanup of Table B. The photo-stimulated cleanup removed surface Cr contamination to below the limits of detection by INAA. The minimum percent removal, therefore (based on the detection limit of the INAA) is at least 96 percent, in contrast with the approximately 13 percent Cr removal using the wet acid cleanup. This is a significant result due to the fact that there are many sources of Cr contamination in a wafer fabrication facility and its associated processing equipment.

FIG. 4 indicates that both the photo-stimulated cleanup of Table A and the wet acid cleanup of Table B removed a larger percent of the Cu surface contamination than was removed for Au or Cr. The wet acid cleanup removed slightly more Cu (approximately 99.5 percent) compared to the photo-stimulated cleanup (approximately 98.5 percent), however the difference between the two results is not statistically significant.

It is important to note that all of the experimental results presented herein are partially plagued by INAA's inability to discern between surface and bulk contamination; however, it is believed that it is better to assay all potential origins of metal contamination and to use a wet acid cleanup control sample to compare with the photo-stimulated cleanup results. As a result of bulk contamination and diffusion effects, the absolute amount of "surface" metal removal could be higher than indicated by the above results.

Figure 5:
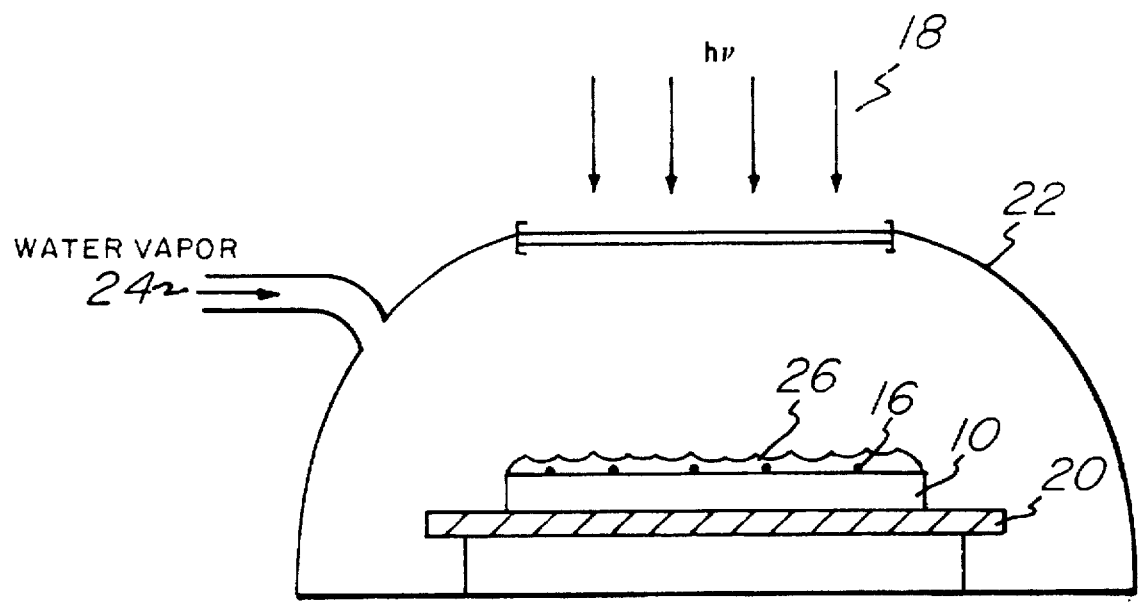
FIG. 5 is a cross sectional diagram of a suitable apparatus setup for implementing a second preferred embodiment method.

Table C lists the steps of a second preferred embodiment of the present invention which is realized by forming a thin layer of water on the contaminated semiconductor surface by vapor phase condensation. FIG. 5 illustrates a suitable apparatus setup to implement the method of Table C. The method commences with step C1 in which the substrate 10 (containing metal contaminants 16) is placed onto a temperature controlled chuck 20. Then, in step C2, the substrate 10/chuck 20 is placed into a vacuum chamber 22 which is then evacuated in step C3. In step C4, the temperature of the chuck 20 (and hence the substrate 10) is lowered to the dew point. Next, in step C5, water vapor 24 is introduced into the chamber 22. After a period of time, a thin layer of condensed water 26 will form preferentially on the substrate 10 surface due to its temperature being at or below the dew point. Then, in step C6, the substrate 10/water 26 is irradiated with visible and ultraviolet light 18 from, for example, a 200 Watt, high pressure, Hg/Xe arc lamp for five minutes. Finally, in step C7, the chamber 22 is evacuated, removing all of the water vapor 24, condensed water 26 and metal contaminants 16. Optionally, the substrate 10 can be rinsed with deionized water for five seconds, for example, and then dried with nitrogen gas.

TABLE C

| C1 | Place substrate onto temperature controlled chuck |
| C2 | Place substrate/chuck into vacuum chamber |
| C3 | Evacuate chamber |
| C4 | Lower temperature of substrate/chuck to dew point |
| C5 | Introduce water vapor into chamber |
| C6 | Irradiate substrate/condensed water with visible/ultraviolet light |
| C7 | Evacuate chamber |

The second preferred embodiment method of Table C may be modified in several ways. For example, instead of using a light source to excite the metal contaminants and/or ambient species, other energy sources such as electron flux, electromagnetic field sources (e.g. RF, microwave, etc.), or energetic ion energy prepared and delivered to the surface by various plasma techniques (e.g. electron cyclotron reactors (ECR), etc) or broad area sources of electrons or ions under high vacuum, for example. After water has condensed onto the surface, the surface may be heated above the dew point to remove all water molecules except those that have already formed adducts with the metal atoms (this will provide for more efficient exposure of the adducts to photo-stimulation). Also, the vapor phase or liquid phase ambient species may be acidic or alkaline (e.g. HCl) or one of the standard wet acid cleanup solutions (e.g. SC-2 ($HCl/H_2O_2/H_2O$)). It will be appreciated that most cleanup scenarios would benefit from an excitation of the metal contaminant and/or Ambient species as described in the foregoing.

Preliminary analysis of silicon surfaces treated with the process of the first preferred embodiment show a fourfold increase of silicon oxide ($SiO_x$) at the surface after treatment (the analysis technique employed is sensitive to a depth of approximately 40 Angstroms). This provides a significant added benefit in that the surface is effectively "sealed" after metal removal to protect it from further contamination before the next processing step can be performed.

A few preferred embodiments have been described in detail hereinabove. It is to be understood that the scope of the invention also comprehends embodiments different from those described, yet within the scope of the claims.

The terms photo-stimulated, photo-illumination, photo-initiated, photoexcitation, etc. are used herein for convenience of description, however the term "photo" may be replaced with "radiant energy" or "energetic ion energy" throughout the specification and the appended claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for the photo-stimulated removal of trace metals from a semiconductor surface, comprising the steps of:

covering said semiconductor surface with deionized water;

irradiating said semiconductor surface and said deionized water with ultraviolet light; and draining said deionized water from said surface.

2. The method of claim 1 further comprising the step of drying said semiconductor surface with nitrogen gas.

3. The method of claim 1 further comprising the step of rinsing said semiconductor surface with deionized water.

4. The method of claim 3 further comprising the step of drying said semiconductor surface with nitrogen gas.

5. The method of claim 1 further comprising causing said deionized water to flow over said surface.

6. The method of claim 1 further comprising agitating said deionized water.

7. The method of claim 1 wherein said irradiating step is provided by a Hg/Xe arc lamp.

8. A method for the photo-stimulated removal of trace metals from a surface of a semiconductor, comprising the steps of:

placing said semiconductor into a vacuum environment;

lowering a temperature of said semiconductor surface to the dew point;

introducing a water vapor into said vacuum environment;

irradiating said semiconductor surface and any condensed water with light; and returning said environment to a vacuum.

9. The method of claim 8 further comprising the step of drying said semiconductor surface with nitrogen gas.

10. The method of claim 8 further comprising the step of rinsing said semiconductor surface with deionized water.

11. The method of claim 10 further comprising the step of drying said semiconductor surface with nitrogen gas.

12. The method of claim 8 wherein said irradiating step is provided by a Hg/Xe arc lamp.

* * * * *